United States Patent [19]
Toda

[11] Patent Number: 5,029,128
[45] Date of Patent: Jul. 2, 1991

[54] SEMICONDUCTOR MEMORY DEVICE WITH FERROELECTRIC CAPACITOR CELLS WITH A PLATE TO WHICH A MID-LEVEL VOLTAGE IS APPLIED

[75] Inventor: Haruki Toda, Yokohama, Japan

[73] Assignee: Kabushiki Kaisha Toshiba, Kawasaki, Japan

[21] Appl. No.: 412,123

[22] Filed: Sep. 25, 1989

[30] Foreign Application Priority Data

Oct. 19, 1988 [JP] Japan .................................. 63-263159

[51] Int. Cl.$^5$ ............................................ G11C 11/22
[52] U.S. Cl. .................................... 365/145; 365/149;
365/203; 365/189.09
[58] Field of Search ............... 365/145, 149, 117, 203,
365/190, 189.09; 357/23.6

[56] References Cited

U.S. PATENT DOCUMENTS

| | | | |
|---|---|---|---|
| 4,799,193 | 1/1989 | Horiguchi et al. | 365/149 |
| 4,853,893 | 8/1989 | Eaton, Jr. et al. | 365/149 |
| 4,873,664 | 10/1989 | Eaton, Jr. | 365/145 |
| 4,893,272 | 1/1990 | Eaton, Jr. et al. | 365/149 |

OTHER PUBLICATIONS

Iversen, "A New Memory Technology is About to Hit the Market," Electronics, pp. 91–95, Feb. 18, 1988.
Evans et al., "An Experimental 512-Bit Nonvolatile Memory with Ferroelectric Storage Cell," IEEE Journal of Solid-State Circuits, vol. 23, No. 5, pp. 1171–1175, Oct. 1988.

Primary Examiner—Glenn Gossage
Attorney, Agent, or Firm—Finnegan, Henderson, Farabow, Garrett and Dunner

[57] ABSTRACT

A semiconductor memory device includes bit line pairs including first and second bit lines to be selectively set at a first logic level or a second logic level, and a first memory cell coupled with the first bit line of the bit line pairs. The first memory cell contains a first ferroelectric capacitor with first and second electrode plates, and a first transistor coupled between the first electrode plate of the first ferroelectric capacitor and the first bit line. A potential at the second electrode plate of the first ferroelectric capacitor is set at a mid value between the first and second logic levels. A distance D (cm) between the first and second electrode plates of the first ferroelectric capacitor being selected such that a minimum voltage $Et \times D$ to saturate the intensity of polarization of the first ferroelectric capacitor is smaller than the value amounting to substantially half of the difference between the first and second logic levels, where Et indicates a field strength sufficient to saturate the intensity of the polarization of the first ferroelectric capacitor and is expressed in V/cm (volts/centimeter).

11 Claims, 9 Drawing Sheets

FIG. 1

$$\left[ VPF = \frac{1}{2}(VH+VL) \right]$$

SEMICONDUCTOR MEMORY DEVICE WITH FERROELECTRIC CAPACITOR CELLS WITH A PLATE TO WHICH A MID-LEVEL VOLTAGE IS APPLIED

BACKGROUND OF THE INVENTION

1. Field of the Invention

The present invention relates to a semiconductor memory device, and more particularly to a semiconductor memory device with memory cells including ferroelectric capacitors.

2. Description of the Related Art

Semiconductor memory devices have been used in a variety of electronic apparatuses, because of such attractive features as small size and large memory capacity. In particular the dynamic RAM is more frequently used than other types of semiconductor memory devices such as the static RAM, because the dynamic RAM may realize a large memory capacity with a small chip area.

A memory cell of the typical dynamic RAM consists of a capacitor for storing data and a MOS transistor for charge transfer. Data is stored in the memory cell by charging the capacitor. A charged state of the capacitor is assigned to storage of data "1", and a noncharged state of the capacitor, to storage of data "0".

As is well known, an amount of charge stored in the capacitor gradually decreases with time due to its leakage. The charge amount decrease phenomenon inevitably occurs also in the memory cells of the dynamic RAM, leading to the deterioration of data stored therein. To cope with this problem, the memory cells are periodically refreshed to recharge the capacitor. The refreshing operation is not performed when the power source is in an off state. Accordingly, when the power switch is turned off, the data in the dynamic RAM is erased.

Thus, the dynamic RAM is advantageous in terms of its small size and large memory capacity, but requires a refreshing operation and hence complicated control.

Recently, many studies have been made to develop a new type of memory device which has a simple cell structure like the dynamic RAM but, unlike the dynamic RAM, does not require a refreshing operation.

Such a new type of memory device, called FRAM (ferroelectric RAM), is described in "Electronics", Feb. 18, 1988, pp 91 to 95 and "IEEE JOURNAL OF SOLID-STATE CIRCUIT", Vol. 23, No. 5, October, 1988, pp 1171 to 1175. The FRAM uses ferroelectric capacitors for data storage. The ferroelectric capacitor has a property that, when it is placed under a predetermined applied voltage, a predetermined electric field is developed therein, and the capacitor retains the electric field even after the applied voltage is removed.

Thus, the FRAM's memory cells do not require refreshing, due to its electric field retaining property.

To secure bi-stable storage states, data "1" and "0", the FRAM needs an additional circuit function to reverse the polarity of the field retained in the ferroelectric capacitor. The above memory device realizes this function by applying a pulse signal to one of the electrode plates of the ferroelectric capacitor. This approach is indeed advantageous in eliminating the refreshing operation. However, it needs an additional circuit for generating pulses, making the entire memory device circuit complicated.

SUMMARY OF THE INVENTION

Accordingly, an object of the present invention is to provide a semiconductor memory device which is simple in circuit construction and does not require refreshing of the memory cells.

To achieve the above object, there is provided a semiconductor memory device comprising: at least one pair of bit lines to be set at a first logic level corresponding to data "1" or a second logic level corresponding to data "0"; a memory cell coupled with one of the paired bit lines, the memory cell containing a ferroelectric capacitor with first and second electrode plates, and a first transistor coupled between the first electrode plate of the ferroelectric capacitor and the one bit line, the first transistor transferring data therebetween; a plate potential setting circuit for setting a potential at the second electrode plate of the ferroelectric capacitor at a mid value between the first and second logic levels; and a distance D (cm) between the first and second electrode plates of the ferroelectric capacitor is selected such that a minimum voltage $Et \times D$, which saturates the intensity of the polarization of the ferroelectric capacitor, is smaller than a value amounting to substantially half of the difference between the first and second logic levels, where Et indicates a field strength sufficient to saturate the intensity of the polarization within the ferroelectric material of the ferroelectric capacitor and is expressed in units of V/cm (volts/centimeter).

With such an arrangement, the potential of the second electrode plate of the ferroelectric capacitor is set at a mid level between the first and second logic levels. The polarity of the voltage applied to the ferroelectric capacitor when the bit line is in the first logic level is different from that when the bit line is in the second logic level. An absolute value of the voltage applied to the capacitor is substantially equal to half the difference between the first and second logic levels. The minimum voltage necessary for saturating the polarization within the capacitor is smaller than half the difference between the first and second logic levels. Accordingly, the capacitor may have bi-stable storage states, data "1" and "0".

Thus, in the FRAM according to the present invention, the polarity of the electric field retained in the ferroelectric capacitor may be reversed by merely applying the mid level voltage to the capacitor, between the first and second logic levels, whereas the conventional FRAM applies a pulse signal to the ferroelectric capacitor for the same purpose.

DETAILED DESCRIPTION OF THE PREFERRED EMBODIMENTS

Figure 1:
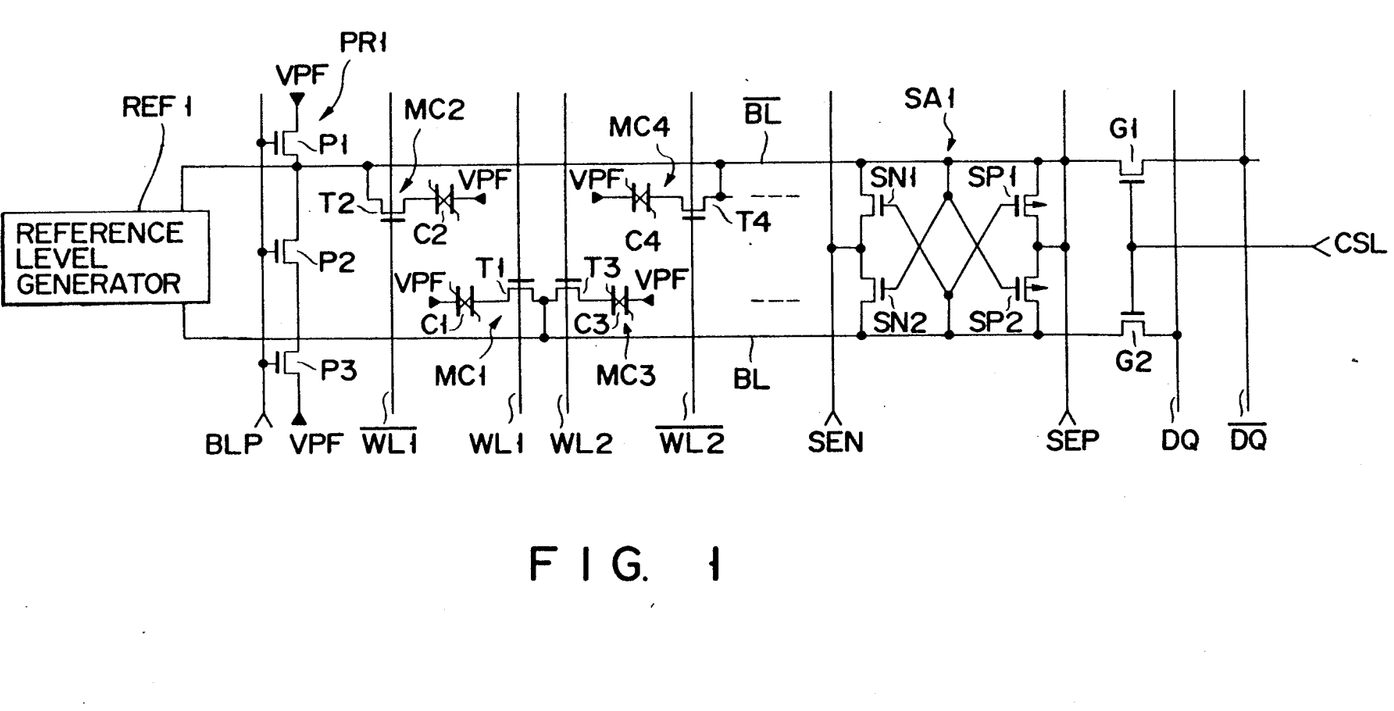
FIG. 1 is a circuit diagram showing a major part of a semiconductor memory according to an embodiment of the present invention.

FIG. 1 shows a circuit arrangement of one column of a semiconductor memory device according to an embodiment of the present invention. Paired bit lines BL and $\overline{BL}$ are provided in a parallel fashion. Of those bit lines, the bit line BL is coupled with memory cells MC1 and MC3. The other bit line $\overline{BL}$ is coupled with memory cells MC2 and MC4. Each of those memory cells MC1 to MC4 is made up of a ferroelectric capacitor and a transistor for charge transfer. Word lines WL1 and WL2 are respectively coupled with the gates of charge transfer transistors T1 and T3 of the memory cells MC1 and MC3. Word lines $\overline{WL1}$ and WL2 are respectively coupled with the gates of charge transfer transistors T2 and T4 of the memory cells MC2 and MC4. The paired bit lines BL and $\overline{BL}$ are coupled with a reference level generator REF1, precharge circuit PR1, and sense amplifier SA1. The reference level generator REF1 generates a reference level voltage to check whether data read out of the memory cell is "1" or "0", and supplies it to the bit line BL or $\overline{BL}$, the precharge circuit PR1 precharges the paired bit lines BL and $\overline{BL}$ for a predetermined period of time, and the sense amplifier SA1 senses and amplifies a potential variation on the paired bit lines BL and $\overline{BL}$. Paired data lines DQ and $\overline{DQ}$ are respectively connected through N channel MOS transistors G1 and G2 to the paired bit lines BL and $\overline{BL}$, respectively. These transistors G1 and G2 are switched by a column select signal CSL derived from a column decoder (not shown).

Details of the memory cells MC1 to MC4 will now be described with reference to FIGS. 2A and 2B. As shown, the memory cells are each made up of a ferroelectric capacitor CF and a charge transfer N channel MOS transistor TF. The capacitor CF substantially consists of a ferroelectric material 20 sandwiched by a couple of electrode or cell plates 21 and 22. One of the cell plates is fixed at potential VPF derived from a plate potential generator which will subsequently be described with reference to FIGS. 12A and 12B. The plate potential VPF is substantially equal to half of the sum of potential VH indicative of data "1" and potential VL indicative of data "0" on paired bit lines BL and $\overline{BL}$; VPF=(VH+VL)/2. The cell plate 22 of the capacitor CF is coupled with a first end of the transistor TF which is connected at a second end to either of the bit lines BL and $\overline{BL}$. The gate of the transistor TF is coupled with a word line coupled to the transistor. The distance D (cm) between the cell plates 21 and 22 of the ferroelectric capacitor CF is set below a predetermined value, which will be described with reference to FIG. 3.

Figure 3:
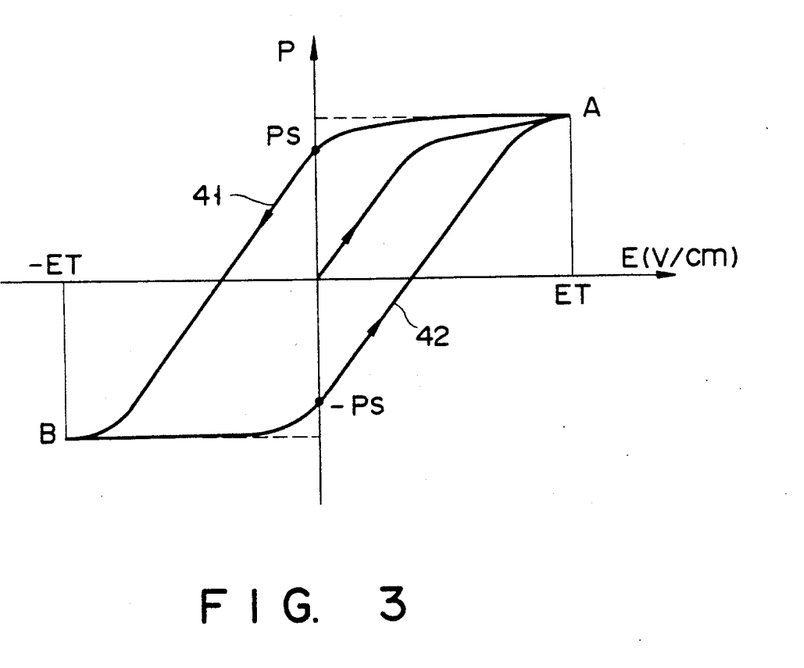
FIG. 3 is a graphical representation of a field retaining property of a ferroelectric capacitor.

The ferroelectric capacitor CF has a field retaining characteristic as shown in FIG. 3. In the graph of FIG. 3, the abscissa represents the intensity of an electric field externally applied to the capacitor CF, viz., field strength E (v/cm)=V (v)/D (cm) developed when bias voltage V (v) is applied between the cell plates 21 and 22 of the capacitor CF. The ordinate represents a spontaneous polarization P. The spontaneous polarization P and the field strength E are coupled by a hysteresis relation, as shown.

Consider a case where domains in the ferroelectric material 20 are polarized randomly or a net polarization in the material is zero, and an electric field is applied to the capacitor under such a condition. The electric field E is gradually increased from zero in the positive direction. The polarization P increases from 0 and reaches value A. Under this condition, further increase of the field E cannot substantially increase the polarization P, and the polarization P remains at the value A. Thus, the polarization P sustained in the capacitor CF is saturated at a fixed value. The field strength at the saturation is denoted as ET in the graph. Then, the field E is decreased to 0. With the decrease of the field E, the polarization P decreases a little along a curve 41 and reaches point Ps at 0 of the field E. Subsequently, the field E is increased in the negative direction. As shown, as it increases, the polarization decreases along the curve 41 and reaches point B. The polarization P will remain at point B even if the field E is further increased in the negative direction. The strength of the field E at point B of the polarization is denoted as −ET. When the field E is decreased from the field strength −Et, the polarization varies a little along the curve 42 and reaches point −Ps at 0 of the field E. Then, the field E is increased positively, the polarization increases along the curve 42 and returns to point A at field strength Et. It is noted here that when the field E is 0, the polarization P is sustained at −Ps.

As seen from the above description, the ferroelectric capacitor CF has such a property that when a bias voltage is applied to the capacitor, an electric field resulting from the polarization caused by the applied bias voltage is developed within the capacitor, and the electric field is sustained therein, even after removal of the bias voltage. The maximum distance D (cm) between the cell plates of the ferroelectric capacitor CF is selected such that the electric field of the capacitor CF, when the bit line potential is at a high level potential VH, is the reversed electric field of the capacitor CF when it is in a low level potential VL. More exactly, the distance D (cm) is selected so as to satisfy the following relation:

$$VH - VPF = VPF - VL = (VH - VL)/2 > ET \times D.$$

In the above relation, the field strength ET at which the intensity of the polarization of the capacitor CF is saturated depends on the nature of the ferroelectric material 20. In the case of lead zirconate titanate (PZT), for example, which is used for the ferroelectric material 20, the saturation field strength ET is approximately 1000 V/cm. If VH=5 V and VL=0 V, $$VPF=(VH+VL)/2=2.5\ V.$$

$$ET \times D < 5\ V - 2.5\ V = 2.5\ V - 0\ V = (5\ V - 0\ V)/2 = 2.5\ V$$

Hence, D<2.5 V/1000 V/cm $$D < 25\ \mu m.$$

With the interplate distance D set at the above figure, the field strength Et to saturate the intensity of the polarization of the capacitor CF is smaller than the voltage VH−VPF or VPF−VL applied to the capacitor CF. Accordingly, the polarization in the capacitor CF may be controlled such that the polarization under the bit line potential VH is opposite in direction to that under the bit line potential VL. This indicates that the ferroelectric capacitor CF is bi-stable and one stable state may be assigned to logic state "1" while the other stable state, to logic state "0".

Figure 2A:
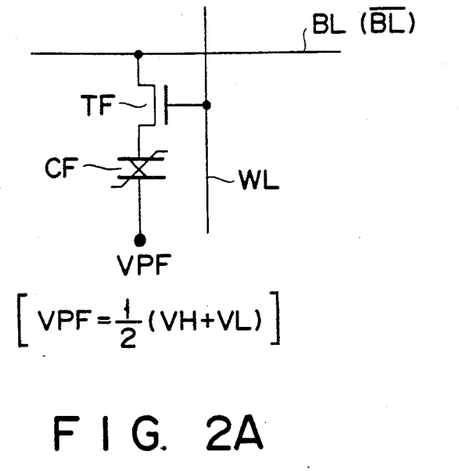
FIG. 2A is an equivalent circuit of a memory cell in the semiconductor memory device of FIG. 1.
Figure 2B:
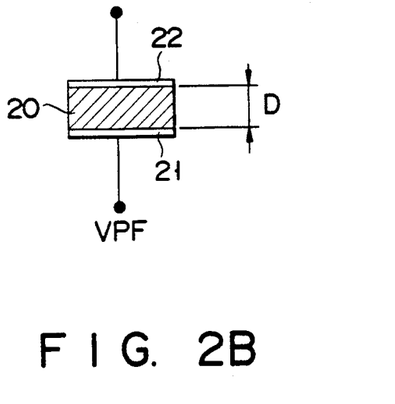
FIG. 2B shows a sectional view of a ferroelectric capacitor in the memory cell.

A structure of the practical memory cell array based on the scheme as illustrated in FIG. 2A will be described with reference to FIGS. 4 and 5.

Figure 4:
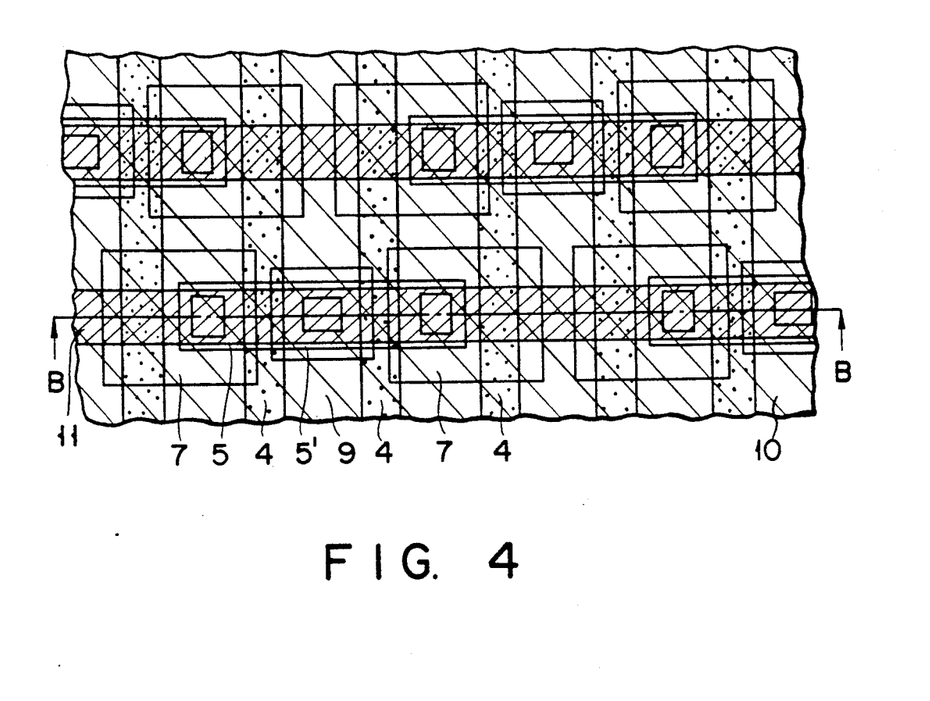
FIG. 4 shows a plane view showing a pattern of the memory cell array using the memory cells as shown in FIG. 2A.
Figure 5:
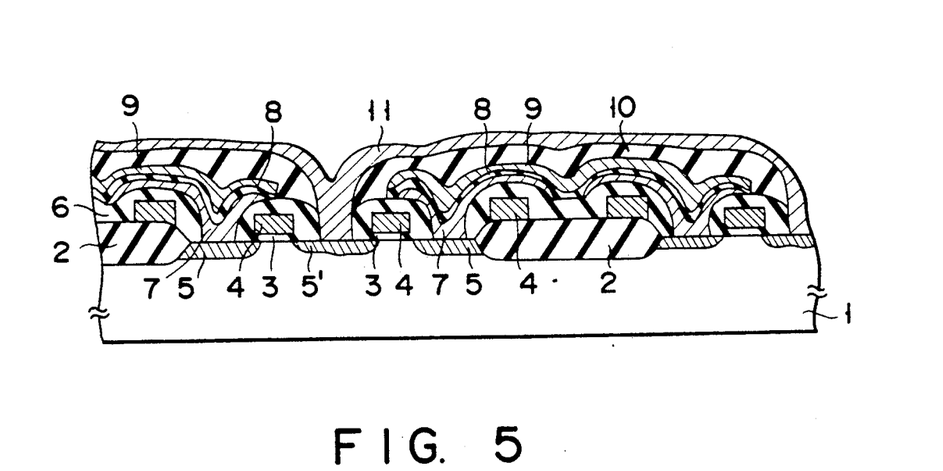
FIG. 5 shows a cross sectional view taken on line B—B in FIG. 4.

FIG. 4 shows a pattern of the memory cell array as viewed from above. FIG. 5 shows a cross section taken along line B—B of FIG. 4. As illustrated, a field oxide film 2 for element isolation is formed on the surface of a silicon substrate 1. First polysilicon layers 4 are formed on a gate insulating film 3 on the surface of the substrate 1. The polysilicon layers 4 are to be used as the gate electrodes of the charge transfer transistors T1 and T3, and the word lines WL1 and WL2 as shown in FIG. 1. Impurity diffusion layers 5 and 5′, which are to serve as sources or drains of the transistors T1 and T3, are formed in the surface of substrate 1, and lie on both sides of each polysilicon layer 4. Additionally, an insulating layer 6 including an oxide film is formed on the substrate 1, and is patterned so as to cover the polysilicon layer 4, as shown. Second polysilicon layers 7, which are to serve as first electrodes of the capacitors C1 and C3, lie on the insulating layer 6, while being partially in contact with the impurity layers 5.

Ferroelectric layers 8 containing lead zirconate titanate (PZT), for example, are respectively formed over the polysilicon layers 7. Third polysilicon layers 9 are formed over the ferroelectric layers 8. The third polysilicon layers 9 are used as the second electrodes of the capacitors C1 and C3. A conductive layer 11, which contacts one end with the impurity diffusion layer 5′ and extends over the structure, is to serve as the bit line BL. The conductive layer 11 consists of a polysilicon layer or a composite layer made of polysilicon or silicide.

As described above, the memory cell of the semiconductor memory device according to the present invention may be realized with a stack structure, like the memory cell of an ordinary dynamic RAM. This fact implies that the chip area required for the memory cell array is small, like that of the dynamic RAM.

Figure 6A:
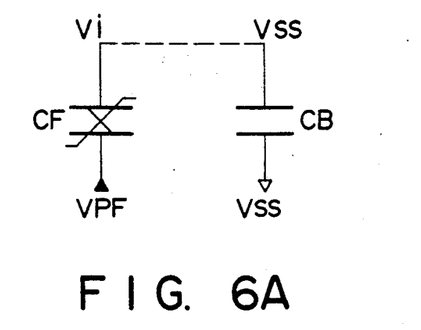
FIGS. 6A through 6C show diagrams useful in explaining the read operation of the semiconductor memory device shown in FIG. 1.
Figure 6B:
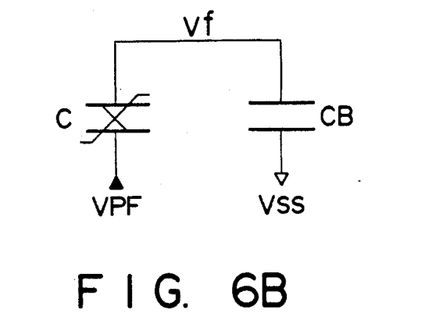

Materials available for the ferroelectric layer 8 other than the PZT contain:

How to read data out of the memory cell array thus arranged will be described with reference to FIGS. 6A through 6C. FIG. 6A shows a model of a memory cell placed in an initial state, viz., before the ferroelectric capacitor is connected to the bit line. FIG. 6B shows a model of a memory cell placed in a final state, viz., after the ferroelectric capacitor is connected to the bit line. In those figures, CB indicates a parasitic capacitance existing in association with the bit line.

Let us consider a model where the potential at the first electrode of the ferroelectric capacitor CF and the bit line potential are respectively set at Vi and ground potential Vss in the initial state, and these potentials are set at Vf in the final state. In this model, relationships of the potential Vf vs. potential Vi may graphically be represented as shown in FIG. 6C. In the graph, a line L1 indicates a Vf−Vi relationship when data "0" is stored in the memory cell. A line L2 indicates a Vf−Vi relationship when data "1" is stored in the memory cell.

When the data stored in the memory cell is "0", the potential Vi at the first cell plate of the capacitor CF may be at any value between the low level potential VL and the plate potential VPF. The reason for this is that after data "0" is written into the memory cell by applying the potential VL to the capacitor CF, the memory cell retains the data "0" unless a potential higher than the plate potential VPF is applied to the capacitor.

When the data stored in the memory cell is "1", the potential Vi may likewise be set at any value between the high potential VH and the plate potential VPF.

It is assumed now that an initial potential across the capacitance CB of the bit line is earth potential Vss, a spontaneous polarization is Ps, the surface area of each of the cell plates of the ferroelectric capacitor CF that face with each other with the ferroelectric material therebetween is A, and capacitance of the capacitor CF is C. On this assumption, when the memory cell is connected to the bit line and the data "0" is stored in the memory cell, the bit line potential Vf is $$Vf=(C \times Vi)/(C+CB).$$

Accordingly, when the potential Vi=VL, the potential Vf is $$Vf=(C \times VL)/(C+CB).$$

When the potential Vi=VPF, the potential Vf is $$Vf=(C \times VPF)/(C+CB).$$

Where the data stored in the memory cell is "1", when the memory cell is connected to the bit line, the polarization in the capacitor CF is reversed and the potential Vf is $$Vf=2APs/(C+CB)+cVi/(C+CB).$$

This indicates that at least 2APs/(C+CB) exists between the potentials Vf of the memory cells storing data "0" and data "1". Accordingly, if the reference level VREF of reference level voltage generated by the reference level generator REF1 is set at APs/(C+CB)+CVPF/(C+CB), the data "1" or "0" of the memory cell may be detected irrespective of the potential Vi.

Figure 6C:
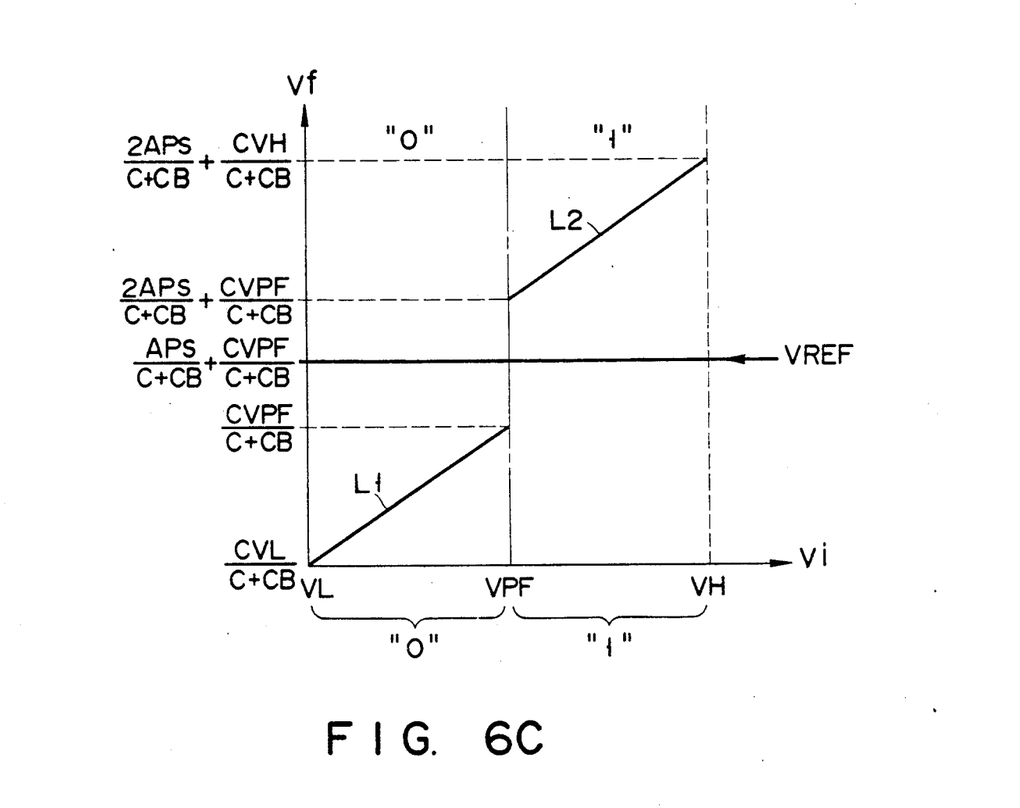

In the case where the bit line potential, before data is read out of the memory cell, is set at the potential of the power source Vcc, the potential Vf in the final state (selected state) is the sum of the value of Vf shown in FIG. 6C and $(CB \times Vcc)/(C+CB)$.

Accordingly, the reference level VREF is $$(A \times Ps)/(C+CB)+(C \times VPF)/(C+CB)+(CB \times Vcc)/(C+CB).$$

Figures 7, 8A, 8B:
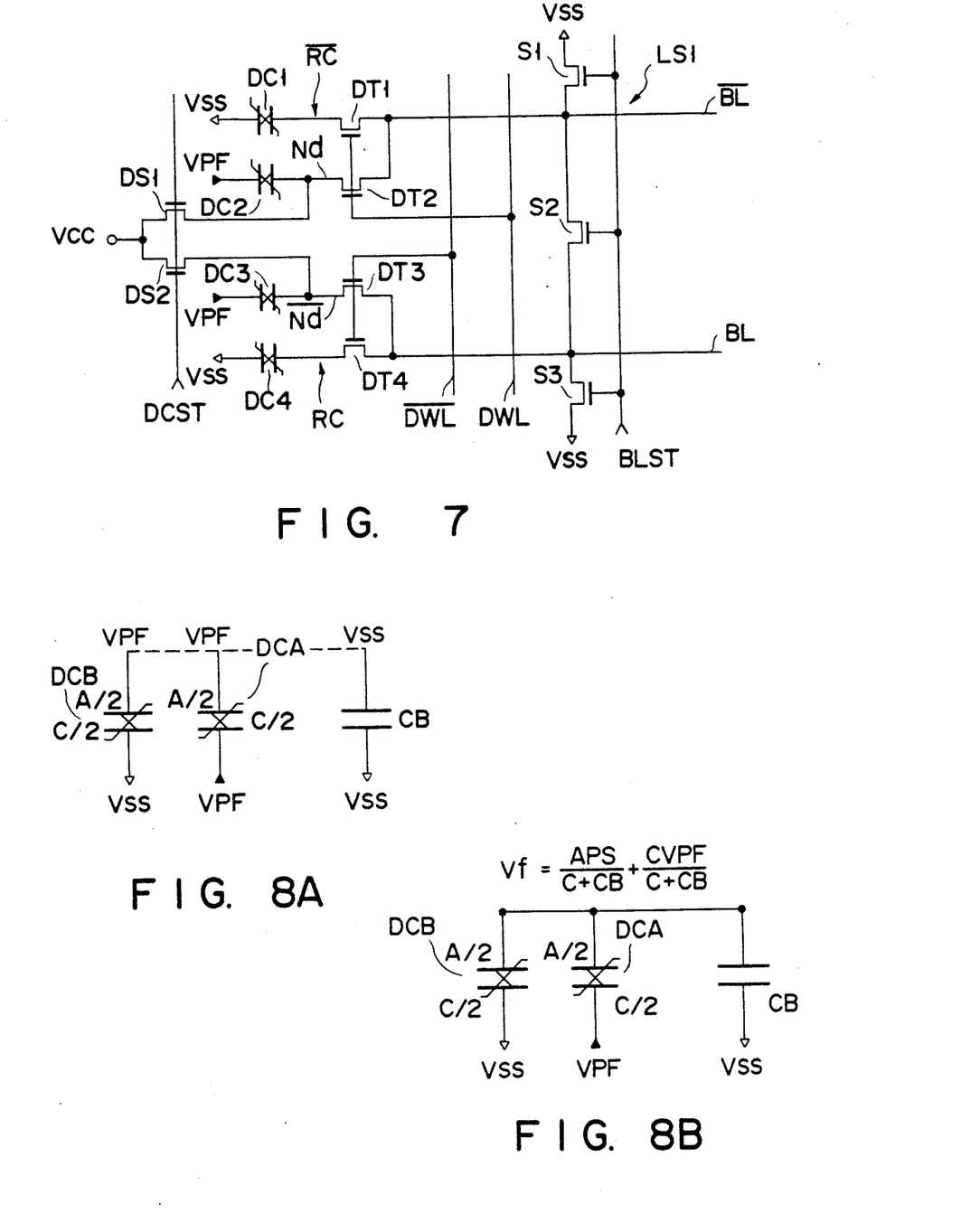
FIG. 7 shows a circuit diagram of a reference level generator.
FIGS. 8A and 8B show explanatory diagrams useful in explaining the generation of a reference level by the reference level generator shown in FIG. 7.

FIG. 7 shows a specific circuit arrangement of the reference level generator REF1 shown in FIG. 1. This circuit arrangement corresponds to a read system of the type in which the bit lines are set to the potential Vss before access to the memory cells. The reference level generator REF1 is made up of reference cells RC and $\overline{RC}$, N channel MOS transistors DS1 and DS2, and bit line potential setting circuit LS1. The bit-line potential setting circuit LS1 is provided with N channel MOS transistors S1 to S3 that are switched in response to a signal BLST. This circuit LS1 sets the paired bit lines BL and $\overline{BL}$ at the ground potential Vss for a predetermined period of time. The reference cells RC and $\overline{RC}$ are connected to the bit lines BL and $\overline{BL}$, respectively. The reference cell $\overline{RC}$ is made up of a couple of reference ferroelectric capacitors DC1 and DC2, and a couple of charge transfer N channel MOS transistors DT1 and DT2. The reference cell RC is also made up of a couple of reference ferroelectric capacitors DC3 and DC4, and a couple of charge transfer N channel MOS transistors DT3 and DT4.

The capacitance and electrode area of each of the reference ferroelectric capacitors DC1 to DC4 are respectively about half those of each of the ferroelectric capacitors CF of the memory cells MC1 to MC4. A dummy word line signal applied from a dummy word line DWL is applied to the gates of the charge transfer transistors DT1 and DT2. One of the cell plates of the capacitor DC1 is connected through the transistor DT1 to the bit line $\overline{BL}$. The other cell plate of the capacitor DC1 is coupled with the ground potential Vss. Similarly, one of the cell plates of the capacitor DC2 is connected through the transistor DT2 to the bit line $\overline{BL}$. The other cell plate of the capacitor DC2 receives the plate potential VPF from a plate potential generator which will be described in detail with reference to FIGS. 12A and 12B.

One of the cell plates of the capacitor DC3 is connected through the transistor DT3 to the bit line BL. The other cell plate of the capacitor DC3 is coupled with the potential VPF. Similarly, one of the cell plates of the capacitor DC4 is connected through the transistor DT4 to the bit line BL. The other cell plate of the capacitor DC4 is coupled with the ground potential Vss.

Data "1" has been stored in the ferroelectric capacitor DC2. Under this condition, when the transistor DT2 is turned on to electrically connect the capacitor DC2 to the bit line $\overline{BL}$, the polarization of the electric field in the capacitor DC2 is inverted by the potential of the bit line $\overline{BL}$, i.e., the ground potential Vss. For a similar reason, data "1" has also been stored in the ferroelectric capacitor DC3.

The N channel MOS transistor DS1 is inserted between the power source Vcc potential terminal and a node Nd between the capacitor DC2 and the transistor DT2. With this connection, data "1" is written into the capacitor DC2 every memory cycle. Similarly, the N channel MOS transistor DS2 is inserted between the power source Vcc potential terminal and a node Nd between the capacitor DC3 and the transistor DT3. With this connection, data "1" is written into the capacitor DC3 every memory cycle.

A reset signal DCST is applied to the gates of the transistors DS1 and DS2.

How the reference level generator REF1 shown in FIG. 7 generates the reference level potential VREF will be described with reference to FIGS. 8A and 8B.

FIG. 8A shows a model of an initial state of the reference capacitors DC3, DC4 in which the reference cell RC is not yet connected to the bit line BL. FIG. 8B shows a model of a final stage (selected state) of the capacitors DC3, DC4 in which reference cell RC is connected to the bit line BL. In those figures, two ferroelectric reference capacitors DC3 and DC4 in the reference cell RC are denoted as DCA and DCB, and a parasitic capacitance of the bit line BL is denoted as CB. The electrode area and capacitance of the capacitors DCA and DCB are respectively A/2 and C/2, which are half those of the ferroelectric capacitor CF of the memory cell. The cell plate potential of the capacitor DCA is fixed at VPF (equal to the cell plate potential of the ferroelectric capacitor CF of the memory cell). The cell plate potential of the capacitor DCB is fixed at the ground potential Vss. In the initial state, data "1" has been stored in the ferroelectric capacitor DCA. When the reference cell RC is connected to the bit line BL, the polarization of an electric field retained in the capacitor DCA is inverted by the ground potential Vss, because the potential of the bit line BL is at the ground potential Vss. In the case of the ferroelectric capacitor DCB, the plate potential is Vss. Accordingly, if it is connected to the bit line BL, data "1" in the initial state is retained as it is. Accordingly, in the final state (selected state) in which the reference cell RC is coupled with the bit line, the potential Vf of the bit line BL is $$Vf=(A \times Ps)/(C+CB)+(C \times VPF)/(C+CB).$$

where the term $(A \times Ps)/(C+CB)$ indicates a component resulting from the inversion of the electric field stored in the capacitor DCA. The value Vf is equal to the reference potential VREF shown in FIG. 6C. In this way, the FIG. 7 circuit can produce the reference potential VREF that is best for detecting the data read out of the memory cell.

While the generation of the reference potential VREF for the reference cell RC has been described, also in the reference cell $\overline{RC}$, bit line $\overline{BL}$ may be set at the reference potential VREF in a similar way.

A read operation of the semiconductor memory device shown in FIG. 1 will be described with reference to the timing chart shown in FIG. 9.

Access to the memory cell MC1 will be described as a model of the read operation. Before access, the dummy word line DWL and $\overline{DWL}$ are at "H" level. Accordingly, the charge transfer transistors DT1 through DT4 in the reference cells RC and $\overline{RC}$ in the reference potential generator REF1 (FIG. 7) are satisfactorily turned on. The word lines WL1, $\overline{WL1}$, WL2, and $\overline{WL2}$ are all at a medium level between the "H" and "L" levels. Accordingly, the charge transfer transistors T1 through T4 in the memory cells MC1 to MC4 are turned on at a relatively high conduction resistance. If the word line potential is set at the medium level before access as described above, then it becomes possible that the bit line potential VPF is applied to one of the cell plates of the ferroelectric capacitor of each memory cell. As a result, the ferroelectric capacitor is prevented from being in a floating state, so that the polarization in the ferroelectric capacitor is free from reversal in direction due to leaks.

The precharge signal BLP is at "H" level and the transistors P1 to P3 in the precharge circuit PR1 are in the ON state. Accordingly, the paired bit lines BL and $\overline{BL}$ are at the level of VPF.

Accordingly, the cell plates of the capacitors DC2 and DC3 closer to the bit lines, viz., node Nd and $\overline{Nd}$, are set at VPF. Similarly, the cell plate potential of the capacitor DC1 and DC4 in the reference cells RC and $\overline{RC}$, that are closer to the bit lines, are set at VPF. Therefore, the capacitors DC1 and DC4 are placed in a state that they have stored data "1". The capacitors DC2 and DC3 are placed in a state where data "1" has been written into those capacitors at the end of the previous access.

The dummy word lines DWL, $\overline{DWL}$, and all of the word lines WL1, $\overline{WL1}$, WL2, and $\overline{WL2}$ are placed in "L" level. The charge transfer transistors DT1 through DT4 in the reference cells RC and $\overline{RC}$, and the charge transfer transistors T1 through T4 in the memory cells MC1 through MC4 are turned off. Afterwards, the precharge signal BLP falls off to turn off the transistors P1 to P3 in the precharge circuit PR1 and the BLST signal rises to turn on the transistors S1 to S3 in the bit line potential setting circuit LS1. As a result, the paired bit lines BL and $\overline{BL}$ are set to the ground potential Vss.

Subsequently, after the BLST signal falls off, the potential of only the word lines WL1 and DWL rises to read data out of the memory cell MC1. The potential rise of these word lines satisfactorily turns on the charge transfer transistor T1 in the memory cell MC1 and the charge transfer transistors DT1 and DT2 in the reference cell $\overline{RC}$. Consequently, the reference potential generator REF1 sets the potential on the bit line $\overline{BL}$ to the reference level VREF, i.e., $\{(A \times Ps)/(C+CB)\} + \{(C \times VPF)/(C+CB)\}$. When data "1" has been stored in the memory cell MC1, the potential on the bit line BL is set to $\{(2A \times Ps)/(C+CB)\} + \{(C \times VPF)/(C+CB)\}$. When data "0" has been stored in the memory cell MC1, the potential on the bit line BL is set to $(C \times VPF)/(C+CB)$. Accordingly, in either case where data "1" is stored in the memory cell MC1 or data "0" is stored, a potential difference of $(A \times Ps)/(C+CB)$ exists between the bit lines BL and $\overline{BL}$. The relation indicates that in the instant semiconductor memory device, the smaller the capacitance C of the ferroelectric capacitor is and the larger the electrode area A of the ferroelectric capacitor is, the larger the potential difference between the bit lines BL and $\overline{BL}$. Therefore, it is preferable that the interplate distance D of the ferroelectric capacitor is selected to be as large as possible within the range of $Et \times D < (VH-VL)/2$, i.e., the reverse condition of the polarization as already mentioned. In this way, the potential difference is caused between the bit lines BL and $\overline{BL}$. Then, a sense operation by the sense amplifier SA1 is performed. In the sense operation, SEP signal rises at the power source potential Vcc, therefore the P channel MOS transistors SP1 and SP2 in the sense amplifier SA1 are turned on.

In turn, the bit line whose potential is higher is set in "H" level, i.e., Vcc potential. Then, the SEN signal falls to the ground potential Vss level, and the N channel MOS transistors SN1 and SN2 in the sense amplifier SA1 are turned on. As a consequence, the bit line whose potential is lower is set to "L" level, i.e., Vss potential.

Figure 9:
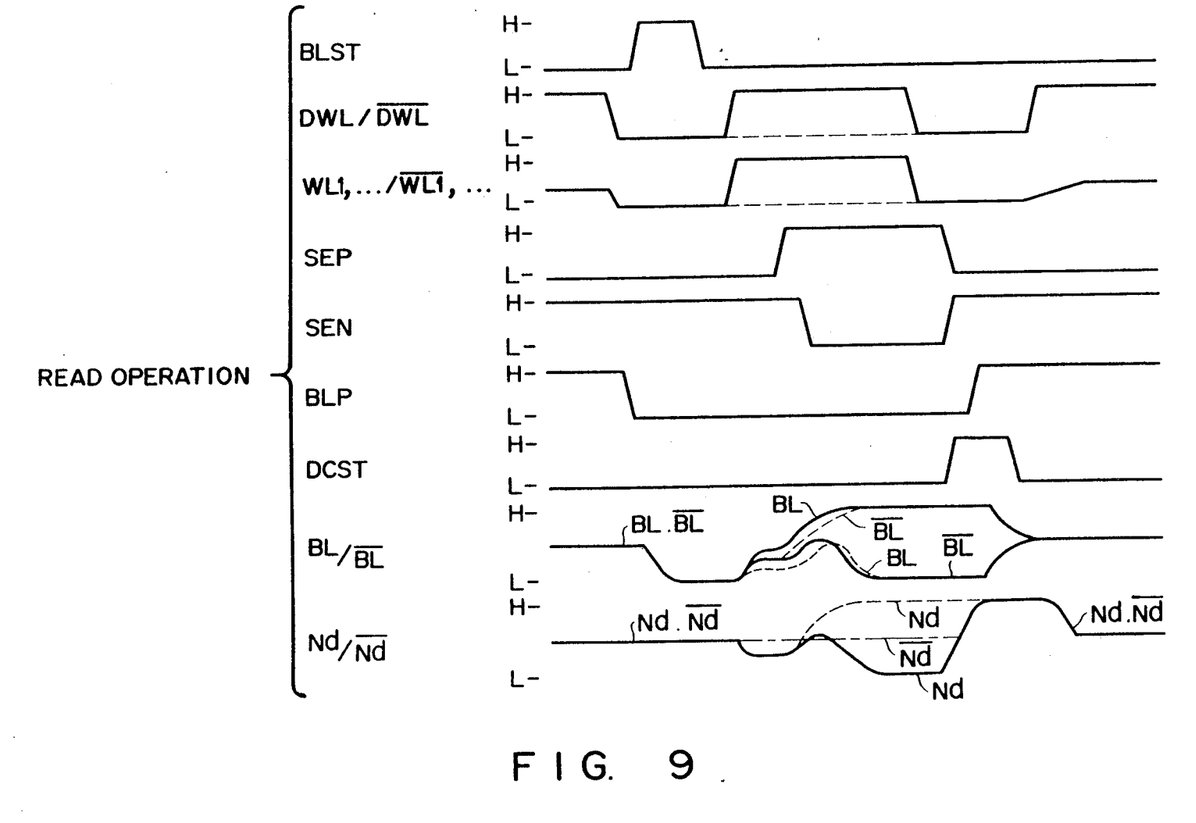
FIG. 9 is a timing chart showing a read operation of the memory device of FIG. 1.

In the timing chart shown in FIG. 9, variations in the potentials on the bit lines BL and $\overline{BL}$ when data "1" is stored in the memory cell MC1 are indicated by continuous lines, while the variations in the potential on the bit lines BL and $\overline{BL}$ when data "0" is stored are indicated by dotted lines. A potential variation at the node Nd is indicated by a continuous line when the memory cell MC1 stores data "1", and by a dotted line when it stores data "0".

In this way, after the potentials on the bit lines BL and $\overline{BL}$ are set at a low level or a high level, a column select signal CSL goes high ("H"), and the transistors G1 and G2 are turned on. As a result, data is transferred to the data lines DQ and $\overline{DQ}$, from the memory cell MC1.

An operation to set up an initial state for the subsequent read cycle follows. In the operation, the potentials on the word line WL1 and the dummy word line DWL that have been high, drop, then the SEP signal drops to the Vss potential, the SEN signal rises to the Vcc level, and the sense amplifier SA1 is reset. Subsequently, the DCST signal rises, the transistors DS1 and DS2 are turned on, and the nodes Nd and Nd rise to approximately "H" level. As a result, data "1" is written into the ferroelectric capacitors DC2 and DC3.

Subsequent to this, the BLP signal rises to turn on the transistors P1 to P3 in the precharge circuit PR1. The bit lines BL and $\overline{BL}$ are precharged up to the potential VPF and equalized.

Approximately at the end of the precharge cycle the potentials of the dummy word lines DWL and $\overline{DWL}$ go high, and all of the word lines WL1, $\overline{WL1}$, WL2 and $\overline{WL2}$ rise to the medium level.

The read operation of the memory device, performed when the bit line potential is set to the ground potential Vss, before data is read out, has been described above. Alternatively, the bit line potential may be set to the power source potential Vcc. In this case, a reference potential generator shown in FIG. 10 is used in place of that of FIG. 7.

Figure 10:
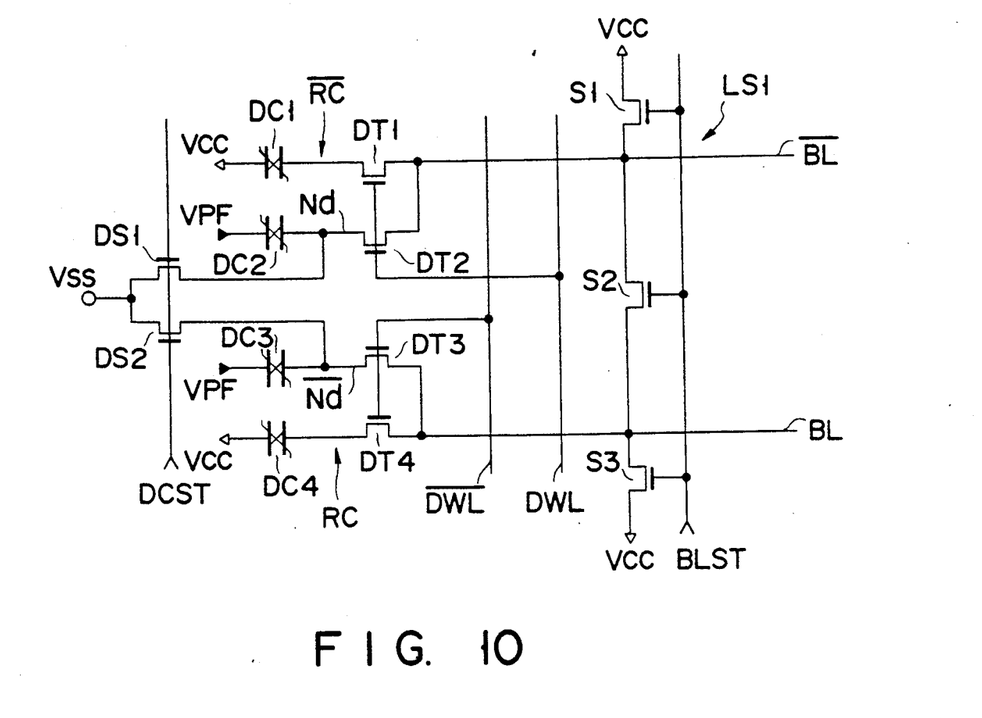
FIG. 10 shows a circuit diagram of another reference level generator.

The reference potential generator shown in FIG. 10 is different from that of FIG. 7 in the following ways. Firstly, the first ends of the transistors S1 and S3 of the bit-line potential setting circuit LS1 are coupled with the power source potential Vcc terminal, not with the ground potential Vss terminal. This is because the bit lines BL and $\overline{BL}$ are set to the Vcc potential before the access starts. In this circuit the transistors S1 to S3 used would be of the P channel type, if the logic level of BLST signal is reversed. Secondly, the common terminal for both the transistors DS1 and DS2 is coupled with the ground potential Vss terminal, not with the power source potential Vcc terminal. The transistors DS1 and DS2 are of the N channel type. This is because data "0" is written into the ferroelectric capacitors DC2 and DC3 of the reference cells $\overline{RC}$ and RC. With the second feature, when capacitor DC2 is coupled with the bit line $\overline{BL}$, the polarity of the electric field retained in the capacitor DC2 may be reversed, and when capacitor DC3 is coupled with the bit line BL, the polarity of the electric field in the capacitor DC3 may be reversed.

The reference potential generator of FIG. 10 may carry out the data read of the type in which the bit line potential is set to the Vcc potential, as the reference potential generator of FIG. 7 carries out the data read of the FIG. 9 timing chart. In the sense amplifier SA1, the N channel MOS transistors SN1 and SN2 are first turned on, and the P channel MOS transistors SP1 and SP2 are then turned on. This is different from that in the FIG. 9 timing chart operation.

Figure 11:
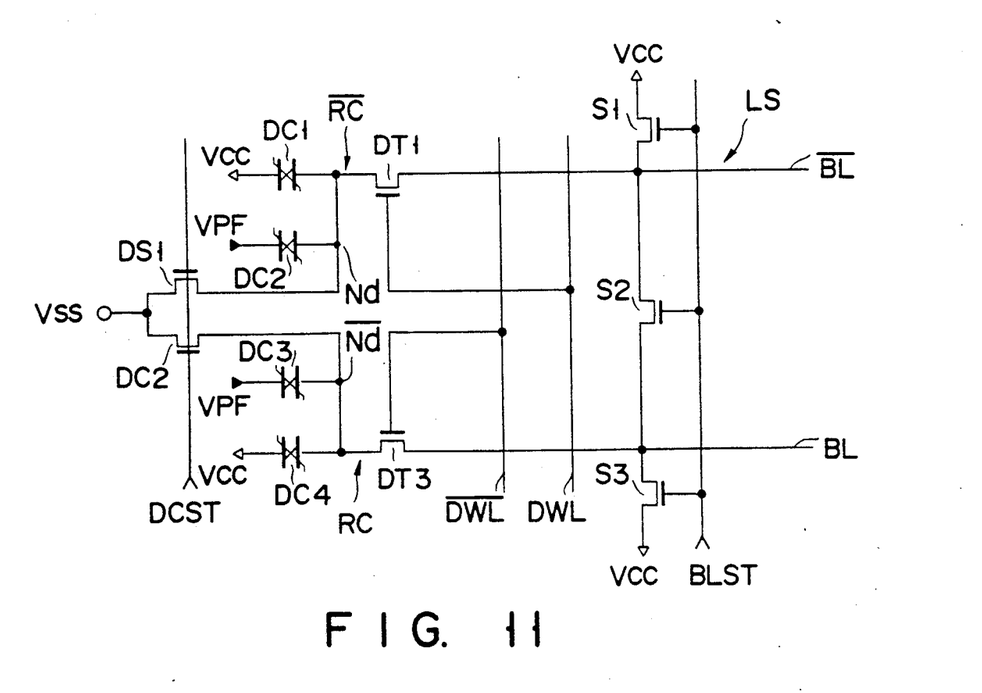
FIG. 11 shows a circuit diagram of yet another reference level generator.

An additional specific example of the reference potential generator REF1 is illustrated in FIG. 11. The present circuit is different from that of FIG. 10 in the arrangements of the reference memory cells RC and $\overline{RC}$. As shown, in the reference potential generator of FIG. 11, a single transistor DT1 is used for a couple of ferroelectric capacitors DC1 and DC2 in the reference cell $\overline{RC}$. Similarly, a single transistor DT3 is used for a couple of ferroelectric capacitors DC3 and DC4 in the reference cell RC.

Thus, in the FIG. 11 circuit, there is no need for the transistors DT2 and DT3, and in this respect, the circuit arrangement as required is simple.

It is evident that the basic technical idea that is implemented into the FIG. 11 circuit is correspondingly applied to the FIG. 7 circuit.

Whereas the read operation of the semiconductor memory device is thus far described, the write operation may be performed like that of ordinary DRAMs.

Figure 12A:
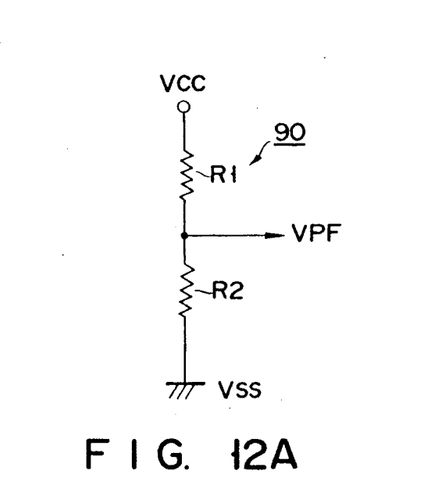
FIGS. 12A and 12 are circuit diagrams of two different plate potential generators, each for generating a plate potential supplied to the memory cells of the memory device.

FIG. 12A shows a specific circuit arrangement of the plate potential generator 90 for generating the plate potential VPF. As shown, a couple of resistors R1 and R2 are connected in series between the power source potential Vcc terminal and the ground potential Vss terminal. A plate potential VPF is derived from a node between those resistors R1 and R2.

Figure 12B:
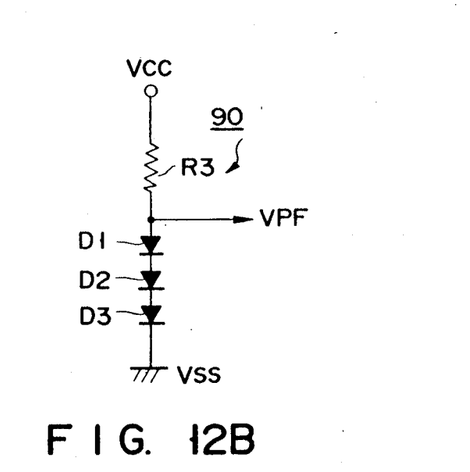

FIG. 12B shows another specific arrangement of the plate potential generator 90. As shown, a resistor R3 and PN junction diodes D1 to D3 are connected in series between the Vcc terminal and the Vss terminal. A node between the resistor R3 and the diode D1 provides a plate potential VPF.

Figure 13:
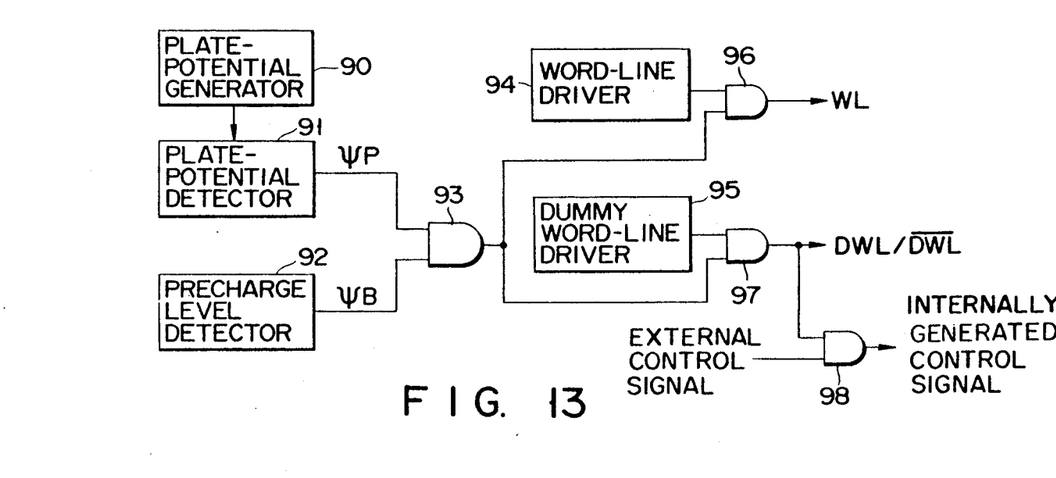
FIG. 13 is a circuit diagram of a peripheral circuit which is provided when the memory device of FIG. 1 is used as a nonvolatile memory device.

As seen from the foregoing description, the semiconductor memory device according to the present invention makes use of ferroelectric capacitors as memory cells. Accordingly, it serves as a nonvolatile memory device which retains data in the absence of power. To further ensure the data protection against power interruption, it is preferable to use a peripheral circuit as shown in FIG. 13 including a plate potential detector 91, bit-line, precharge level detector 92, and AND gates 93, 96, 97, and 98.

The plate potential detector 91 detects an output signal of the plate potential generator 90, and produces an output signal $\psi$P of "H" level when the detected output signal reaches the potential VPF. The bit-line precharge level detector 92 is for detecting a state where the bit lines are precharged to the potential VPF and produces a signal $\psi$B in "H" level. The signals $\psi$P and $\psi$B are applied to the AND gate 93. The output signal of this AND gate is applied to a first input of the AND gate 96 and a first input of the AND gate 97. The second input of the AND gate 96 is coupled with the output signal of a word-line driver 94. The second input of the AND gate 97 is coupled with the output signal derived from a dummy word-line driver 95. With this connection, only when the AND gate 93 produces an "H" level signal, the AND gate 96 allows the output signal of the word-line driver 94 to be applied to the word line WL. Only when the AND gate 93 produces an "H" level signal, the AND gate 97 allows the output signal of the dummy word-line driver 95 to be applied to the dummy word line DWL.

In a situation where the plate potential to be supplied to the ferroelectric capacitors of the memory cell and the bit line potential are not set at VPF, and if the word lines are driven, the data stored in the memory cell may be destroyed. The peripheral circuit thus arranged is capable of reliably protecting the data of the memory cell and the dummy cell even in such a situation. In the peripheral circuit, the word lines and the dummy word lines cannot be driven until the plate potential VPF is supplied to the ferroelectric capacitors of the memory cell and the bit lines are precharged up to the potential VPF.

To protect the data in the memory cells and the reference cells in the absence of power, it is preferable to shut off the supply of the cell plate potential VPF after the cells are completely disconnected from the bit lines. When the power is off, the bit lines are in a floating state. It is desirable to make it as slow as possible for the bit lines to be placed in the floating state. The reason for this is that when the bit line pair is in the floating state, a transient voltage may be transferred through the bit lines to the memory cells and the reference cells.

Figure 14:
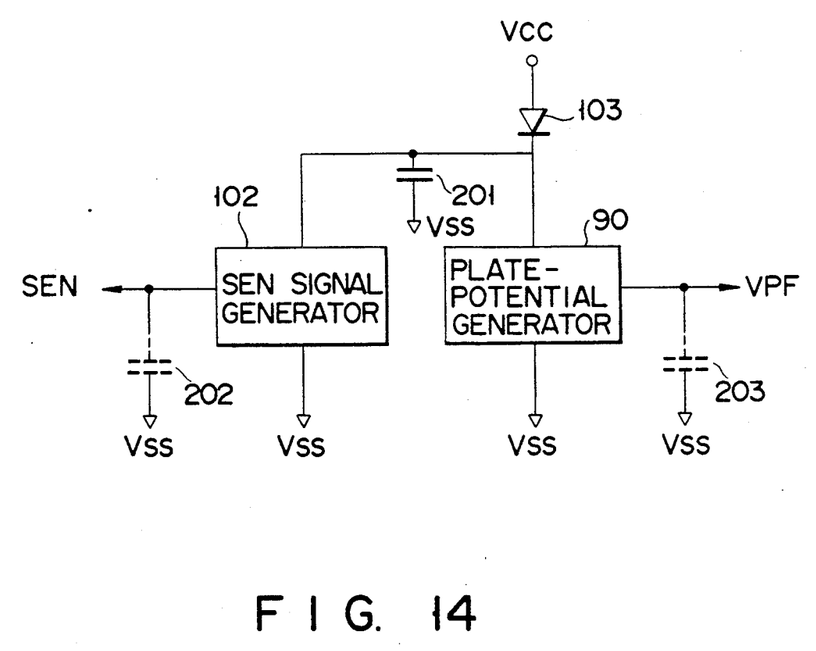
FIG. 14 is a circuit diagram showing the connection of the plate potential generator and the power source terminal that is used when the memory device of FIG. 1 is used as a nonvolatile memory device.

The above maximum delay of the state progression of the bit lines toward the floating state may be realized by a circuit arrangement of FIG. 14. As shown, the plate potential generator 90 and a SEN signal generator 102 are coupled with the power source Vss terminal, through a PN junction diode 103. The diode 103 shuts off the flow of the current from the power source terminals of the circuits 90 and 102 toward the Vcc terminal. With this arrangement, because of the presence of the parasitic capacitances 201, 202 and 203, turning off the plate potential generator 90 and the SEN signal generator 102 is delayed behind turning off the wordline driver 94 and the dummy word-line driver 95. Therefore, the data in the memory cells and the reference cells can be reliably protected when the power supply is interrupted.

What is claimed is:

1. A semiconductor memory device comprising:
   bit line pairs including first and second bit lines to be selectively set at a first logic level corresponding to data "1" or a second logic level corresponding to data "0";
   a first memory cell coupled with said first bit line of said bit line pairs, said first memory cell containing a first ferroelectric capacitor with first and second electrode plates, and a first transistor connected between said first electrode plate of said first ferroelectric capacitor and said first bit line, said first transistor transferring data therebetween;
   plate potential setting means for setting a potential at said second electrode plate of said first ferroelectric capacitor at a mid. value between said first and second logic levels; and
   a distance D (cm) between said first and second electrode plates of said first ferroelectric capacitor being selected such that a minimum voltage Et×D to saturate an intensity of the polarization of said first ferroelectric capacitor is smaller than a voltage amounting to substantially half of the voltage difference between said first and second logic levels, where Et indicates a field strength sufficient to saturate the intensity of the polarization of said first ferroelectric capacitor and is expressed in V/cm (volts/centimeter).

2. The semiconductor memory device according to claim 1, in which said first transistor includes a source region and a drain region which are separately formed on a semiconductor substrate, and a gate electrode formed on an insulating layer laid on said substrate, and said first ferroelectric capacitor includes a first conductive layer serving as said first electrode plate and being formed on said substrate so as to be coupled with said source region, a ferroelectric layer formed on said first conductive layer, and a second conductive layer formed on said ferroelectric layer and serving as said second electrode plate.

3. The semiconductor memory device according to claim 1, further comprising a second memory cell coupled with said second bit line of said bit line pairs, said second memory cell containing a second ferroelectric capacitor with first and second electrode plates, and a second transistor connected between said first electrode plate of said second ferroelectric capacitor and said second bit line, said second transistor transferring data therebetween, and in which the potential at said second electrode plate of said second ferroelectric capacitor is selectively set at a mid value between said first and second logic levels by said plate potential setting means, and a distance D (cm) between said first and second electrode plates of said second ferroelectric capacitor is selected such that a minimum voltage Et×D to saturate the intensity of the polarization of said second ferroelectric capacitor is smaller than a voltage amounting to substantially half the voltage difference between said first and second logic levels, where Et indicates a field strength sufficient to saturate the intensity of the polarization of said second ferroelectric capacitor and is expressed in V/cm (volts/centimeter).

4. The semiconductor memory device according to claim 3, further comprising a reference potential generating means such that when said first memory cell is selected, said reference potential generating means sets said second bit line at a predetermined reference potential, and when said second memory cell is selected, said reference potential generating means sets said first bit line at said predetermined reference potential, and sense amplifying means for amplifying a potential difference between said first and second bit lines, and sense amplifying means for setting one of said first and second bit lines in said first logic level and the other in said second logic level. claim 1, in which said first transistor includes a source region and a drain region which are separately formed on a semiconductor substrate, and a gate electrode formed on an insulating layer laid on said substrate, and said first ferroelectric capacitor includes a first conductive layer serving as said first electrode plate and being formed on said substrate so as to be coupled with said source region, a ferroelectric layer formed on said first conductive layer, and a second conductive layer formed on said ferroelectric layer and serving as said second electrode plate.

5. The semiconductor memory device according to claim 1, further comprising a reference potential generating means such that when said first memory cell is selected, said reference potential generating means sets said second bit line at a predetermined reference potential, and sense amplifying means for amplifying a potential difference between said first bit line to be set at a potential in accordance with data read out of said first memory cell and said second bit line to be set at said reference potential by said reference potential generating means, and sense amplifying means for setting one of said first and second bit lines in said first logic level and the other in said second logic level.

6. The semiconductor memory device according to claim 5, in which said reference potential generated by said reference potential generating means is a mid potential between the potential of said first bit line as set in accordance with date "1" read out of said first memory cell and the potential of said first bit line as set in accordance with data "0" read out of said first memory cell.

7. The semiconductor memory device according to claim 5, in which said reference potential generating means includes a reference cell coupled with said second bit line, and said reference cell includes first and second ferroelectric capacitors each having first and second electrode plates, and data transfer means being connected between said first electrode plates of said first and second ferroelectric capacitors and said second bit line, and transferring data therebetween.

8. The semiconductor memory device according to claim 7, in which the capacitance C and electrode plate area A of each said first and second ferroelectric capacitors of said reference cell are half those of said ferroelectric capacitor of said first memory cell.

9. The semiconductor memory device according to claim 7, in which said second electrode plate of said first ferroelectric capacitor of said reference cell is connected to a selected one of the power source potential supply terminal for supplying said first logic level and the ground potential supply terminal for supplying said second logic level, and said second electrode plate of said second ferroelectric capacitor of said reference cell is connected to the output of said plate potential setting means so as to be set at a mid potential between said first and second logic levels.

10. The semiconductor memory device according to claim 7, in which said reference potential generating means further includes bit line potential setting means for setting said first and second bit lines at said second logic level before said second bit line is set at said reference potential, and reference data write means for writing reference data into said second ferroelectric capacitor of said reference cell so that the polarity of an electric field retained in said second ferroelectric capacitor of said reference cell is reversed by the potential of said second logic level on said second bit line 11. The semiconductor memory device according to claim 7, further comprising precharge means for precharging said first and second bit lines at a mid potential between said first and second logic levels, plate potential detecting means for detecting the potential of said second electrode plate of said first ferroelectric capacitor of said first memory cell, and access control means allowing access to said first memory cell when said bit line potential detecting means detects a state wherein said first and second bit lines are precharge to a potential midway between said first and second logic levels and said plate potential detecting means detects a state wherein the potential of said second electrode plate of said first ferroelectric capacitor of said first memory cell is set at a potential midway between said first and second logic levels.

* * * * *

UNITED STATES PATENT AND TRADEMARK OFFICE
CERTIFICATE OF CORRECTION

PATENT NO. : 5,029,128
DATED : July 02, 1991
INVENTOR(S) : Haruki TODA

It is certified that error appears in the above-identified patent and that said Letters Patent is hereby corrected as shown below:

Claim 4, column 13, line 45-55, delete "claim 1, ....... electrode plate."

Claim 6, column 14, line 9, change "date" to --data--.

Claim 11, column 14, line 57, change "precharge" to --precharged--.

Signed and Sealed this

Twenty-ninth Day of September, 1992

Attest:

DOUGLAS B. COMER

Attesting Officer   Acting Commissioner of Patents and Trademarks